United States Patent
Sun et al.

(10) Patent No.: US 10,401,725 B2
(45) Date of Patent: Sep. 3, 2019

(54) MASK COVER AND MASK

(71) Applicant: BOE TECHNOLOGY GROUP CO., LTD., Beijing (CN)

(72) Inventors: Zhongyuan Sun, Beijing (CN); Wenqi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 80 days.

(21) Appl. No.: 15/324,381

(22) PCT Filed: May 16, 2016

(86) PCT No.: PCT/CN2016/082218
§ 371 (c)(1),
(2) Date: Jan. 6, 2017

(87) PCT Pub. No.: WO2017/140052
PCT Pub. Date: Aug. 24, 2017

(65) Prior Publication Data
US 2018/0180990 A1   Jun. 28, 2018

(30) Foreign Application Priority Data

Feb. 18, 2016   (CN) .......................... 2016 1 0091362

(51) Int. Cl.
*G03F 1/64* (2012.01)
*C23C 14/04* (2006.01)
(Continued)

(52) U.S. Cl.
CPC .............. *G03F 1/64* (2013.01); *C23C 14/042* (2013.01); *C23C 14/24* (2013.01); *G03F 7/70733* (2013.01); *G03F 7/70758* (2013.01)

(58) Field of Classification Search
CPC ... G03F 1/142; G03F 1/62; G03F 1/64; G03F 1/66; G03F 7/70066; G03F 7/70716; C23C 14/042
See application file for complete search history.

(56) References Cited

U.S. PATENT DOCUMENTS 5,151,928 A * 9/1992 Hirose .................... B82Y 10/00
250/483.1
5,203,392 A * 4/1993 Shea ........................ A62C 2/242
160/133
(Continued)

FOREIGN PATENT DOCUMENTS

CN   101840149 A   9/2010
CN   102466963 A   5/2012
(Continued)

OTHER PUBLICATIONS

Search Report and Written Opinion dated Sep. 27, 2016 from State Intellectual Property Office of the P.R. China.

*Primary Examiner* — Steven Whitesell Gordon
(74) *Attorney, Agent, or Firm* — Dilworth & Barrese, LLP.; Michael J. Musella, Esq.

(57) ABSTRACT

A mask cover (10) and a mask are provided. The mask cover (10) comprises a bracket (11) and at least one adjusting unit (12), each adjusting unit (12) includes a shielding plate (121) and a driving component (122), the bracket (11) has an opening portion (111), and at least a portion of the opening portion (111) corresponds to the adjusting unit (12). The shielding plate (121) has a first end and a second end, the second end is fixed on the bracket (11), and the first end is an end opposite to the second end. The shielding plate (121) in an initial state is provided on a side of the opening portion (111). The driving component (122) is installed on the bracket (11) and is connected with the first end of the shielding plate (121), the driving component (122) is con-
(Continued)

figured to drive the first end of the shielding plate (121) to move in the first direction (A), so that at least a portion of the shielding plate (121) is released from the side of the opening portion (111), to adjust a size of a portion of the opening portion (111) covered by the shielding plate (121) along the first direction (A), and the first direction (A) is a direction from the second end to the first end of the shielding plate (121).

13 Claims, 5 Drawing Sheets

(51) Int. Cl.
    *G03F 7/20*      (2006.01)
    *C23C 14/24*      (2006.01)

(56) References Cited

U.S. PATENT DOCUMENTS

| | | | | |
|---|---|---|---|---|
| 5,780,861 | A * | 7/1998 | Apelgren | G03F 1/64 250/492.1 |
| 6,566,018 | B2 | 5/2003 | Muzio et al. | |
| 6,597,002 | B1 * | 7/2003 | Kondo | G03F 7/70066 250/492.2 |
| 2005/0157285 | A1 * | 7/2005 | Schothorst | G03F 7/70066 355/71 |
| 2010/0002220 | A1 * | 1/2010 | Tanaka | G03F 7/70066 355/71 |
| 2013/0273746 | A1 * | 10/2013 | Kawato | H01L 51/0008 438/758 |
| 2013/0292666 | A1 * | 11/2013 | Sonoda | C23C 14/042 257/40 |
| 2016/0047034 | A1 * | 2/2016 | Uchiyama | C23C 14/042 204/298.11 |
| 2016/0070180 | A1 * | 3/2016 | Hwang | G03F 7/70733 355/75 |

FOREIGN PATENT DOCUMENTS

| | | |
|---|---|---|
| CN | 102650820 A | 8/2012 |
| CN | 103207517 A | 7/2013 |
| CN | 105549321 A | 5/2016 |

* cited by examiner

MASK COVER AND MASK

TECHNICAL FIELD

Embodiments of the present disclosure relate to a mask cover and a mask.

BACKGROUND

A photoetching process or an evaporation process is often used in a fabrication procedure of a display panel. A mask needs to be used in both the photoetching process and the evaporation process. The mask has an opening region, a light or an evaporation gas passes the opening region, so that a photoetched pattern or an evaporated pattern is formed on a substrate.

In the fabrication procedure of the display panel, in the case that the photoetched patterns or the evaporated patterns which have different thicknesses need to be formed within different regions on a single substrate, it is necessary to use a plurality of masks having opening regions of different sizes, which increases processes for fabricating the display panel.

SUMMARY

According to embodiments of the disclosure, a mask cover is provided. The mask cover comprises a bracket and at least one adjusting unit, each adjusting unit includes a shielding plate and a driving component, the bracket has an opening portion, and at least a portion of the opening portion corresponds to the adjusting unit. The shielding plate has a first end and a second end, the second end is fixed on the bracket, and the first end is an end opposite to the second end; the shielding plate in an initial state is provided on a side of the opening portion; the driving component is installed on the bracket and is connected with the first end of the shielding plate, the driving component is configured to drive the first end of the shielding plate to move in the first direction, so that at least a portion of the shielding plate is released from the side of the opening portion, to adjust a size of a portion of the opening portion covered by the shielding plate along the first direction, and the first direction is a direction from the second end to the first end of the shielding plate.

For example, the bracket is provided with an accommodating component for accommodating the shielding plate in the initial state.

For example, the accommodating component includes a shielding plate rotating shaft, the shield plate rotating shaft has an axis line perpendicular to the first direction and parallel to an extending plane of the opening portion, the second end of the shielding plate is connected with the shielding plate rotating shaft, and the second end of the shielding plate is wound around the shielding plate rotating shaft in the case that the shielding plate is in the initial state.

For example, the accommodating component further includes a reset mechanism connected with the shielding plate rotating shaft, and the reset mechanism is configured for driving the shielding plate rotating shaft to rotate.

For example, the reset mechanism is a spring or a motor connected with the shielding plate rotating shaft.

For example, the accommodating component includes an accommodating chamber provided on the side of the opening portion, and the shielding plate is accommodated in the accommodating chamber in the case that it is in the initial state.

For example, the driving component includes a driving shaft, a motor, and at least one connecting line; the driving shaft is provided on a side of the opening portion away from the second end of the shielding plate; the motor is installed on the bracket and is connected with the driving shaft so as to drive the driving shaft to rotate about an axis line of the driving shaft; and a first end of the connecting line is fixed on the driving shaft and a second end of the connecting line is connected with the first end of the shielding plate, and the connecting line is wound around the driving shaft in the case that the driving component drives the driving shaft to rotate so that the first end of the shielding plate moves in the first direction.

For example, there are two connecting lines; and the two connecting lines are respectively provided on both sides of the opening portion in a third direction, the third direction is perpendicular to the first direction and parallel to an extending plane of the opening portion.

For example, the opening portion extends in the first direction, two side walls of the opening portion parallel to the first direction are respectively provided with a chute, and openings of the chutes provided on the two side walls of the opening portion are opposed to each other and extend in the first direction; and at least a portion of two side edges of the shielding plate parallel to the first direction is provided within the chute and capable of sliding along the chute with respect to the bracket.

For example, the mask cover comprises a plurality of adjusting units arranged side by side in a third direction, the third direction is perpendicular to the first direction and parallel to an extending plane of the opening portion.

According to the embodiments of the disclosure, a mask is provided. The mask comprises the mask cover as described above. The opening portion of the mask cover is provided to correspond to at least a portion of a pattern region of the mask.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
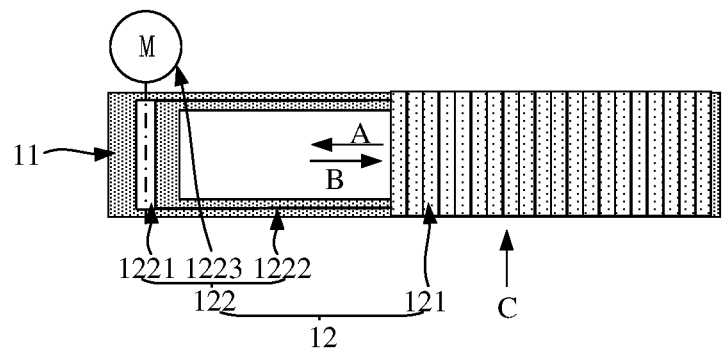
FIG. 1 is a structural schematic view illustrating a mask cover according to embodiments of the present disclosure.
Figure 2:
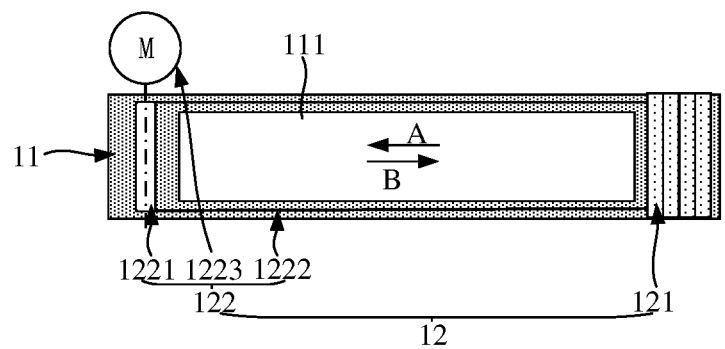
FIG. 2 is a structural schematic view illustrating the mask cover in the case that a shielding plate is in an initial state according to the embodiments of the present disclosure.
Figure 3:
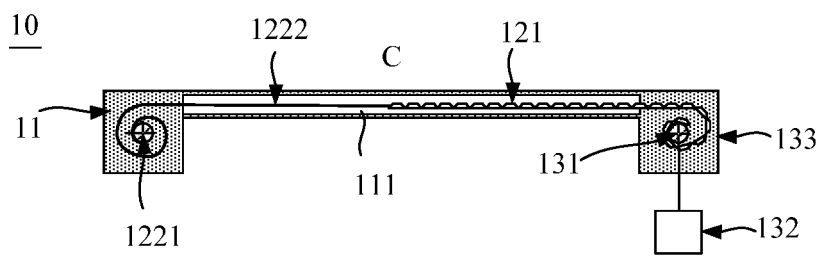
FIG. 3 is a side structural schematic view illustrating the mask cover shown in FIG. 1.

As shown from FIG. 1 to FIG. 3, embodiments of the present disclosure provide a mask cover 10, comprising a bracket 11 and an adjusting unit 12. The adjusting unit 12 includes a shielding plate 121 and a driving component 122, and the shielding plate 121 for example is a flexible structure which is foldable or windable. The bracket 11 has an opening portion 111 corresponding to the adjusting unit 12. For example, in the case that the mask cover 10 is applied to a photoetching process, the opening portion 111 is a region of the bracket 11 trough which a light is tramsmitted; and in the case that the mask cover 10 is applied to an evaporation process, the opening portion 111 is a region of the bracket 11 through which an evaporation gas passes. For example, the opening portion 111 according to the embodiments of the present disclosure is a hollow region formed on the bracket 11, so that the light is transmitted or the evaporation gas passes.

For example, as shown in FIG. 1, the shielding plate 121 has a first end and a second end, the second end is fixed on the bracket 11, and the first end is an end opposite to the second end. In FIG. 1, a first direction A is a direction from the second end to the first end of the shielding plate 121, a second direction B is a direction opposite to the first direction A, and the first direction A and the second direction B are parallel to an extending plane of the opening portion 111.

For example, as shown in FIG. 2, in the second direction B, the shielding plate 121 in an initial state is provided on a side of the opening portion 111. For example, as shown in FIG. 2, the shielding plate 121 in the initial state does not shield the opening portion 111 at all.

As shown in FIG. 1, the driving component 122 is installed on the bracket 11 and is connected with the first end of the shielding plate 121, the driving component 122 is configured to drive the first end of the shielding plate 121 to move in the first direction A, so that at least a portion of the shielding plate 121 is released from the side of the opening portion 111, to adjust a size of a portion of the opening portion 111 covered by the shielding plate 121 along the first direction A.

The mask cover 10 comprises the bracket 11 and the adjusting unit 12, the bracket 11 has the opening portion 111 corresponding to the adjusting unit 12, the adjusting unit 12 includes the shielding plate 121 and the driving component 122, a size of an area of a region where the shielding plate 121 covers the opening portion 111 is adjusted by the driving component 122. In the production process of the display panel, by adjusting the size of the area of the region where the shielding plate 121 covers the opening portion 111, opening portions 111 of different sizes are formed on the mask cover 10, so as to change a size of an opening region of a mask which is in coordination with the mask cover 10; in this way, one piece of mask can provide a plurality of opening regions of different sizes, and further one piece of mask can implement forming different patterns in different regions on the substrate. Therefore, the mask cover 10 reduces the number of masks used in the production process of the display panel, and simplifies the production process of the display panel.

In the above-described embodiments, one opening portion 111 is provided with one adjusting unit 12 correspondingly, and under the driving of the driving component 122, the shielding plate 121 completely covers the opening portion 111 in the case that the shielding plate 121 is fully expanded. In addition, the opening portion 111 and the adjusting unit 12 may be provided as follows.

Figure 4:
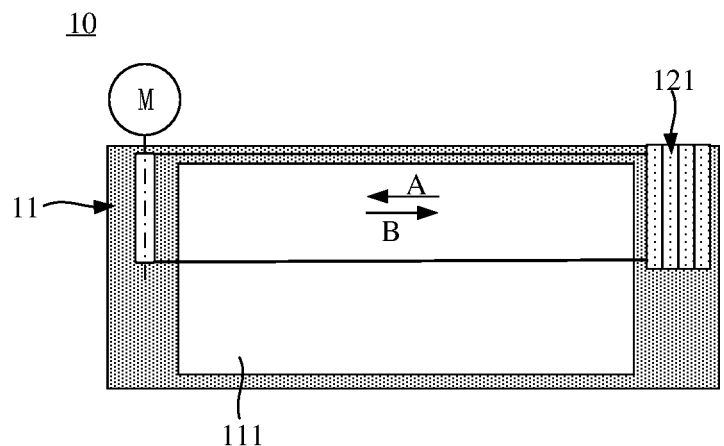
FIG. 4 is another structural schematic view illustrating the mask cover according to the embodiments of the present disclosure.

For example, as shown in FIG. 4, an area of the opening portion 111 is larger than an area of the shielding plate 121, and the shielding plate 121 covers only a part of the opening portion 111 even though the shielding plate 121 fully expanded.

Figure 5:
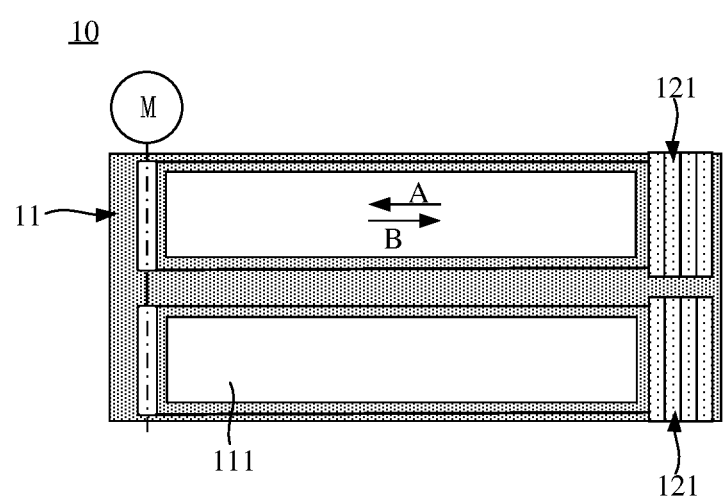
FIG. 5 is another structural schematic view illustrating the mask cover according to the embodiments of the present disclosure.

For example, as shown in FIG. 5, each bracket is provided with two adjusting units arranged side by side, and an arrangement direction of the two adjusting units 12 is perpendicular to the first direction A and parallel to the extending plane of the opening portion 111. According to actual production needs, the adjusting unit can be provided more than one.

For example, the bracket 11 is provided with an accommodating component for accommodating the shielding plate 121 in the case that the shielding plate 121 is in the initial state.

For example, as shown in FIG. 3, the accommodating component includes a shielding plate rotating shaft 131, the shielding plate rotating shaft 131 has an axis line perpendicular to the first direction A and parallel to the extending plane of the opening portion 111, the second end of the shielding plate 121 is connected with the shielding plate rotating shaft 131, and the second end of the shielding plate 121 is wound around the shielding plate rotating shaft 131 in the case that the shielding plate 121 is in the initial state. For example, the accommodating component further includes a reset mechanism connected with the shielding plate rotating shaft 131, and the reset mechanism 132 is configured for driving the shielding plate rotating shaft 131 to rotate so that the shielding plate 121 is wound around the shielding plate rotating shaft 131. For example, the reset mechanism 132 is a spring or a motor connected with the shielding plate rotating shaft 131.

In the case that the first end of the shielding plate 121 is driven by the driving component 122 to cover the opening portion 111 along the first direction A, at least a portion of the shielding plate 121 is unwound from the shielding plate rotating shaft 131. In addition, the reset mechanism 132 drives the shielding plate rotating shaft 131 to rotate so that the shielding plate 121 is wound around the shielding plate rotating shaft 131, thereby driving the first end of the shielding plate 121 to move in the second direction B opposite to the first direction A, in this way, the area of the portion of the shielding plate 121 covering the opening portion 111 is reduced, and further the shielding plate 121 is restored to the initial state.

For example, the accommodating component further includes an accommodating chamber 133 provided on the side of the opening portion 111, and the shielding plate 121 is accommodated in the accommodating chamber in the case that it is in the initial state. For example, the shielding plate 121 is accommodated in the accommodating chamber 133 by winding or folding.

For example, as shown in FIG. 1, FIG. 2 and FIG. 3, the driving component 122 includes a driving shaft 1221, a motor 1223, and a connecting line 1222.

For example, the driving shaft is provided on a side of the opening portion away from the second end of the shielding plate. For example, the driving shaft 1221 is provided on the side of the opening portion 111 away from the shielding plate rotating shaft 131, and is parallel to the shielding plate rotating shaft 131; the motor 1223 is installed on the bracket 11 and is connected with the driving shaft 1221 so as to drive the driving shaft 1221 to rotate about an axis line of the driving shaft 1221; a first end of the connecting line 1222 is fixed on the driving shaft 1221 and a second end of the connecting line 1222 is connected with the first end of the shielding plate 121; and the connecting line 1222 is wound around the driving shaft 1221 in the case that the driving component 122 drives the driving shaft 1221 to rotate, so that the first end of the shielding plate 121 moves in the first direction A.

The connecting line 1222 for example is at least one. For example, in order to improve movement stability of the first end of the shielding plate 121 and to prevent the connecting line 1222 from shielding the opening portion 111, there are two connecting lines 1222, and the two connecting lines are respectively provided on both sides of the opening portion 111 in a third direction; and the third direction is perpendicular to the first direction A and is parallel to the extending plane of the opening portion 111.

Figure 6A:
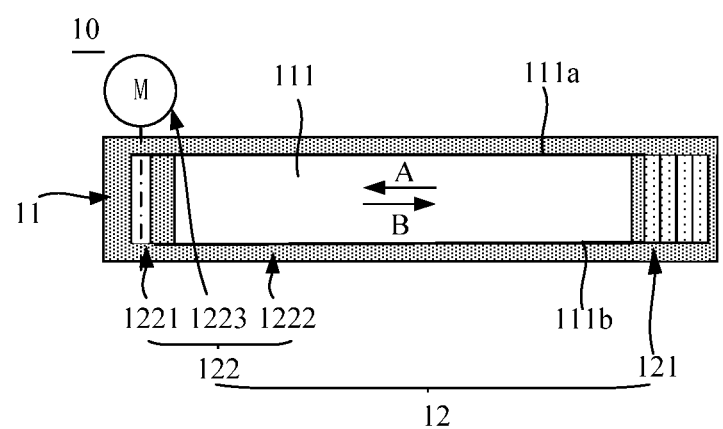
FIG. 6*a* is another structural schematic view illustrating the mask cover according to the embodiments of the present disclosure.
Figure 6B:
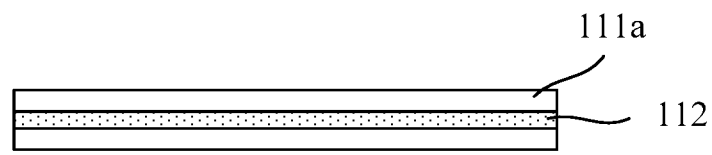
FIG. 6*b* is a structural schematic view illustrating a side wall of an opening portion of the mask cover of FIG. 6*a*.

For example, as shown in FIG. 6a and FIG. 6b, the opening portion 111 of the bracket 11 is a rectangular opening, and the opening portion 111 extends in the first direction A. In order to improve movement stability of the first end of the shielding plate 121, for example, two side walls 111a and 111b of the opening portion 111 of the bracket 11 parallel to the first direction A are respectively provided with a chute 112, and openings of the chutes 112 provided on the two side walls 111a and 111b of the opening portion 111 are opposed to each other and extend in the first direction A; and at least a portion of two side edges of the shielding plate 121 parallel to the first direction A is provided within the chute and capable of sliding along the chute with respect to the bracket 11.

For example, as shown from FIG. 1 to FIG. 3, a width of the shielding plate 121 in the third direction is larger than a width of the opening portion 111 in the third direction. For example, in FIG. 6a and FIG. 6b, the width of the shielding plate 121 in the third direction is equal to the width of the opening portion 111 in the third direction. For example, as described above, the third direction is perpendicular to the first direction A and is parallel to the extending plane of the opening portion 111.

Figure 7:
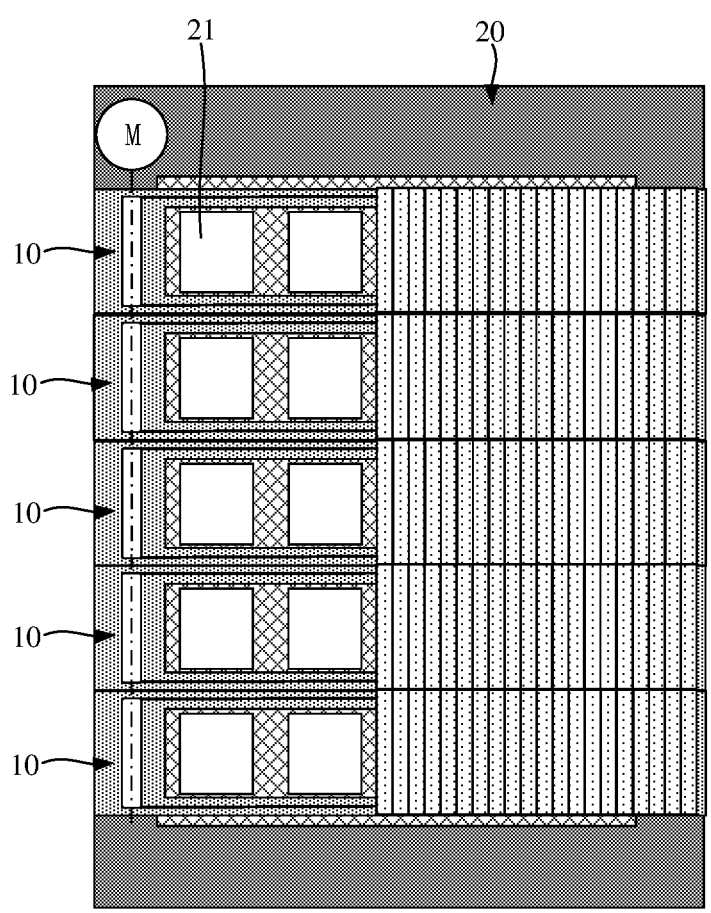
FIG. 7 is a structural schematic view illustrating a mask according to the embodiments of the present disclosure.
Figure 8:
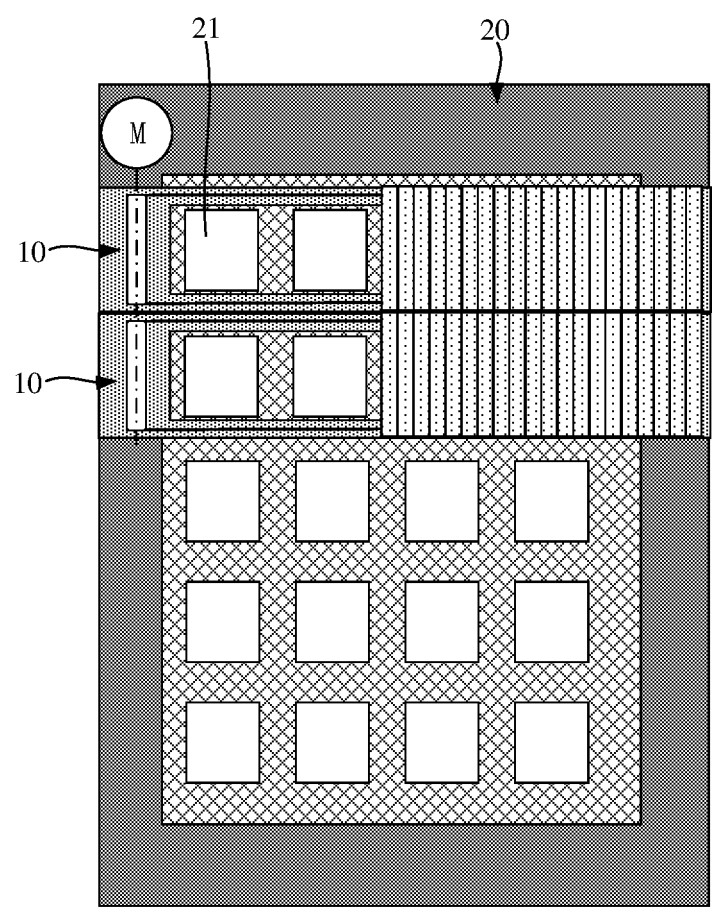
FIG. 8 is another structural schematic view illustrating the mask according to the embodiments of the present disclosure.

As shown in FIG. 7 and FIG. 8, the embodiments of the present disclosure further provide a mask, comprising the mask cover 10 as described above and a mask main body 20. The mask main body 20 comprises a pattern region 21, and the opening portion 111 of the mask cover 10 is provided to correspond to the pattern region 21 of the mask.

For example, as shown in FIG. 7, the pattern regions 21 of the mask are all provided with corresponding mask cover 10. For example, as shown in FIG. 8, a portion of the pattern regions 21 of the mask is provided with corresponding mask cover 10.

The mask cover 10 comprises the bracket 11 and the adjusting unit 12, the bracket 11 has the opening portion 111 corresponding to the adjusting unit 12, the adjusting unit 12 includes the shielding plate 121 and the driving component 122, the size of the area of the region where the shielding plate 121 covers the opening portion 111 is adjusted by the driving component 122. In the production process of the display panel, by adjusting the size of the area of the region where the shielding plate 121 covers the opening portion 111, opening portions 111 of different sizes are formed on the mask cover 10, so as to change the size of the opening region of the mask which is in coordination with the mask cover 10; in this way, one piece of mask can provide a plurality of opening regions of different sizes, and further one piece of mask can implement forming different patterns in different regions on the substrate. Therefore, the mask cover 10 reduces the number of masks used in the production process of the display panel, and simplifies the production process of the display panel.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201610091362.5 filed on Feb. 18, 2016, the present disclosure of which is incorporated herein by reference in its entirety as part of the present application.

The invention claimed is:
1. A mask cover, comprising:
a bracket and at least one adjusting unit, each adjusting unit including a shielding plate and a driving component, the bracket having an opening portion, and at least a portion of the opening portion corresponding to the adjusting unit, wherein
the shielding plate has a first end and a second end, the second end is fixed on the bracket, and the first end is an end opposite to the second end:
the shielding plate in an initial state is provided on a side of the opening portion;
the driving component is installed on the bracket and is connected with the first end of the shielding plate, the driving component is configured to drive the first end of the shielding plate to move in the first direction, so that at least a portion of the shielding plate is released from the side of the opening portion thus the opening portion comprises a first portion covered by the shielding plate and a second portion which is transparent and not covered by the shielding plate, the shielding plate adjusts a size of the second portion, which is transparent and not covered by the shielding plate, of the opening portion along the first direction, and the first direction is a direction from the second end to the first end of the shielding plate;
the bracket is provided with an accommodating component for accommodating the shielding plate in the initial state;
the accommodating component comprises a shielding plate rotating shaft, the shield plate rotating shaft has an axis line perpendicular to the first direction and parallel to an extending plane of the opening portion, the second end of the shielding plate is connected with the shielding plate rotating shaft, and the second end of the shielding plate is wound around the shielding plate rotating shaft in the case that the shielding plate is in the initial state.
2. The mask cover according to claim 1, wherein the accommodating component further includes a reset mecha- nism connected with the shielding plate rotating shaft, and the reset mechanism is configured for driving the shielding plate rotating shaft to rotate.

3. The mask cover according to claim 2, wherein the reset mechanism is a spring or a motor connected with the shielding plate rotating shaft.

4. The mask cover according to claim 1, wherein the accommodating component includes an accommodating chamber provided on the side of the opening portion, and the shielding plate is accommodated in the accommodating chamber in the case that it is in the initial state.

5. The mask cover according to claim 1, wherein the mask cover comprises a plurality of adjusting units arranged side by side in a third direction, the third direction is perpendicular to the first direction and parallel to an extending plane of the opening portion.

6. A mask, comprising the mask cover according to claim 1, wherein the opening portion of the mask cover is provided to correspond to at least a portion of a pattern region of the mask.

7. The mask cover according to claim 1, wherein the shielding plate is foldable or windable.

8. The mask cover according to claim 1, wherein the shielding plate in the initial state is provided on the side of the opening portion, on which the second end of shielding plate is fixed on the bracket.

9. The mask cover according to claim 1, wherein the shielding plate completely covers the opening portion in the case that the shielding plate is fully expanded.

10. The mask cover according to claim 1, wherein an area of the opening portion is larger than an area of the shielding plate, and the shielding plate covers only a part of the opening portion even though the shielding plate is fully expanded.

11. A mask cover, comprising:
a bracket and at least one adjusting unit, each adjusting unit including a shielding plate and a driving component, the bracket having an opening portion, and at least a portion of the opening portion corresponding to the adjusting unit, wherein
the shielding plate has a first end and a second end, the second end is fixed on the bracket, and the first end is an end opposite to the second end;
the shielding plate in an initial state is provided on a side of the opening portion;
the driving component is installed on the bracket and is connected with the first end of the shielding plate, the driving component is configured to drive the first end of the shielding plate to move in the first direction, so that at least a portion of the shielding plate is released from the side of the opening portion thus the opening portion comprises a first portion covered by the shielding plate and a second portion which is transparent and not covered by the shielding plate, the shielding plate adjusts a size of the second portion, which is transparent and not covered by the shielding plate, of the opening portion along the first direction, and the first direction is a direction from the second end to the first end of the shielding plate;

the driving component includes a driving shaft, a motor, and at least one connecting line;
the driving shaft is provided on a side of the opening portion away from the second end of the shielding plate;
the motor is installed on the bracket and is connected with the driving shaft so as to drive the driving shaft to rotate about an axis line of the driving shaft; and
a first end of the connecting line is fixed on the driving shaft and a second end of the connecting line is connected with the first end of the shielding plate, and the connecting line is wound around the driving shaft in the case that the driving component drives the driving shaft to rotate so that the first end of the shielding plate moves in the first direction.

12. The mask cover according to claim 11, wherein
there are two connecting lines; and
the two connecting lines are respectively provided on both sides of the opening portion in a third direction, the third direction is perpendicular to the first direction and parallel to an extending plane of the opening portion.

13. A mask cover, comprising:
a bracket and at least one adjusting unit, each adjusting unit including a shielding plate and a driving component, the bracket having an opening portion, and at least a portion of the opening portion corresponding to the adjusting unit, wherein
the shielding plate has a first end and a second end, the second end is fixed on the bracket, and the first end is an end opposite to the second end;
the shielding plate in an initial state is provided on a side of the opening portion;
the driving component is installed on the bracket and is connected with the first end of the shielding plate, the driving component is configured to drive the first end of the shielding plate to move in the first direction, so that at least a portion of the shielding plate is released from the side of the opening portion thus the opening portion comprises a first portion covered by the shielding plate and a second portion which is transparent and not covered by the shielding plate, the shielding plate adjusts a size of the second portion, which is transparent and not covered by the shielding plate, of the opening portion along the first direction, and the first direction is a direction from the second end to the first end of the shielding plate;
the opening portion extends in the first direction, two side walls of the opening portion parallel to the first direction are respectively provided with a chute, and openings of the chutes provided on the two side walls of the opening portion are opposed to each other and extend in the first direction; and
at least a portion of two side edges of the shielding plate parallel to the first direction is provided within the chute and capable of sliding along the chute with respect to the bracket.

\* \* \* \* \*